(12) United States Patent
Ouyang (10) Patent No.: US 9,996,280 B2
(45) Date of Patent: Jun. 12, 2018

(54) DATA REGISTER COPYING FOR NON-VOLATILE STORAGE ARRAY OPERATIONS

(71) Applicant: SanDisk Technologies, Inc., Plano, TX (US)

(72) Inventor: Jingwen Ouyang, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/071,100

(22) Filed: Mar. 15, 2016

(65) Prior Publication Data

US 2017/0269856 A1    Sep. 21, 2017

(51) Int. Cl.
  *G06F 3/06*    (2006.01)
  *G11C 16/10*    (2006.01)
  *G11C 16/32*    (2006.01)

(52) U.S. Cl.
  CPC ............ *G06F 3/0619* (2013.01); *G06F 3/065* (2013.01); *G06F 3/0656* (2013.01); *G06F 3/0688* (2013.01); *G11C 16/10* (2013.01); *G11C 16/32* (2013.01); *G11C 2207/2245* (2013.01)

(58) Field of Classification Search
  CPC ............... G06F 3/0656; G06F 12/0238; G06F 12/0246; G06F 3/0688; G06F 3/065
  USPC ........................................................ 711/103
  See application file for complete search history.

(56) References Cited

U.S. PATENT DOCUMENTS

| | | | |
|---|---|---|---|
| 5,488,711 A | 1/1996 | Hewitt et al. | |
| 6,671,204 B2 | 12/2003 | Im | |
| 7,663,950 B2 | 2/2010 | Moogat et al. | |
| 7,733,703 B2 | 6/2010 | Li | |
| 7,936,602 B2 | 5/2011 | Li et al. | |
| 7,961,512 B2 | 6/2011 | Li et al. | |
| 8,737,125 B2 | 5/2014 | Pan et al. | |
| 8,819,328 B2 | 8/2014 | Lassa et al. | |
| 8,842,476 B2 | 9/2014 | Sakai et al. | |
| 8,861,269 B2 | 10/2014 | Chen et al. | |
| 9,042,160 B1* | 5/2015 | Gorobets | G11C 16/10 365/148 |
| 9,135,989 B2 | 9/2015 | Sakai et al. | |
| 2007/0255891 A1* | 11/2007 | Chow | G06F 12/0804 711/103 |

(Continued)

OTHER PUBLICATIONS

PCT International Application No. PCT/US2017/022555 International Search Report and Written Opinion dated Jun. 23, 2017.

*Primary Examiner* — Than Nguyen
(74) *Attorney, Agent, or Firm* — Kunzler, PC (57) ABSTRACT

Apparatuses, systems, methods, and computer program products are disclosed for data register copying for a non-volatile storage array. An apparatus may include an array of non-volatile storage cells. A set of write buffer data registers may be configured to store target data for a program operation for an array. Write buffer data registers may communicate target data to corresponding columns of an array. A set of shadow data registers may be configured to receive target data from peripheral circuitry for an array. A portion of target data received by a shadow data register may be copied to a corresponding write buffer data register while the shadow data register receives the portion of the target data.

17 Claims, 7 Drawing Sheets

(56) References Cited

U.S. PATENT DOCUMENTS

| | | |
|---|---|---|
| 2008/0019196 A1 | 1/2008 | Lin |
| 2010/0080060 A1 | 4/2010 | Chen et al. |
| 2013/0024605 A1 | 1/2013 | Sharon et al. |
| 2015/0221348 A1 | 8/2015 | Tseng et al. |
| 2016/0011779 A1 | 1/2016 | Lee |
| 2016/0027481 A1 | 1/2016 | Hong |

\* cited by examiner

DATA REGISTER COPYING FOR NON-VOLATILE STORAGE ARRAY OPERATIONS

TECHNICAL FIELD

The present disclosure, in various embodiments, relates to data storage and more particularly relates to copying data between data registers for write or read operations of a non-volatile storage array.

BACKGROUND

A page register or page buffer may store data for writing to a non-volatile storage array, or data that has been read from the non-volatile storage array. A column or bit line of the storage array may be coupled to a data register, latch, buffer, or the like, that stores data of a read or write operation for the column. Multiple data registers or latches for a column of the storage array may provide additional caching or buffering. For example, a first data register for a column of the array may store data for an ongoing write operation, while a second data register for the column receives additional data for a subsequent write operation.

SUMMARY

Apparatuses are presented for data register copying for a non-volatile storage array. In one embodiment, an apparatus includes an array of non-volatile storage cells. In a certain embodiment, a set of write buffer data registers is configured to store target data for a program operation for an array. In a further embodiment, write buffer data registers communicate target data to corresponding columns of an array. In one embodiment, a set of shadow data registers is configured to receive target data from peripheral circuitry for an array. In a certain embodiment, a portion of target data received by a shadow data register is copied to a corresponding write buffer data register while a shadow data register receives the portion of the target data.

Methods are presented for data register copying for a non-volatile storage array. In one embodiment, a method includes receiving target data, using a shadow data latch, for a program operation that writes the target data to an array of non-volatile memory cells. In a certain embodiment, a method includes copying target data to a write buffer data latch before additional target data is received by an adjacent shadow data latch. In a further embodiment, a method includes writing target data from a write buffer data latch to an array.

An apparatus for data register copying, in another embodiment, includes means for receiving target data, using a set of shadow data registers, for a program operation that writes the target data to an array of non-volatile storage cells. In a certain embodiment, an apparatus includes means for copying target data to a set of write buffer data registers, so that a portion of the target data received by a shadow data register is copied to a corresponding write buffer data register before a subsequent portion of the target data is received by an adjacent shadow data register. In a further embodiment, an apparatus includes means for writing target data from a set of write buffer data registers to an array.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1A:
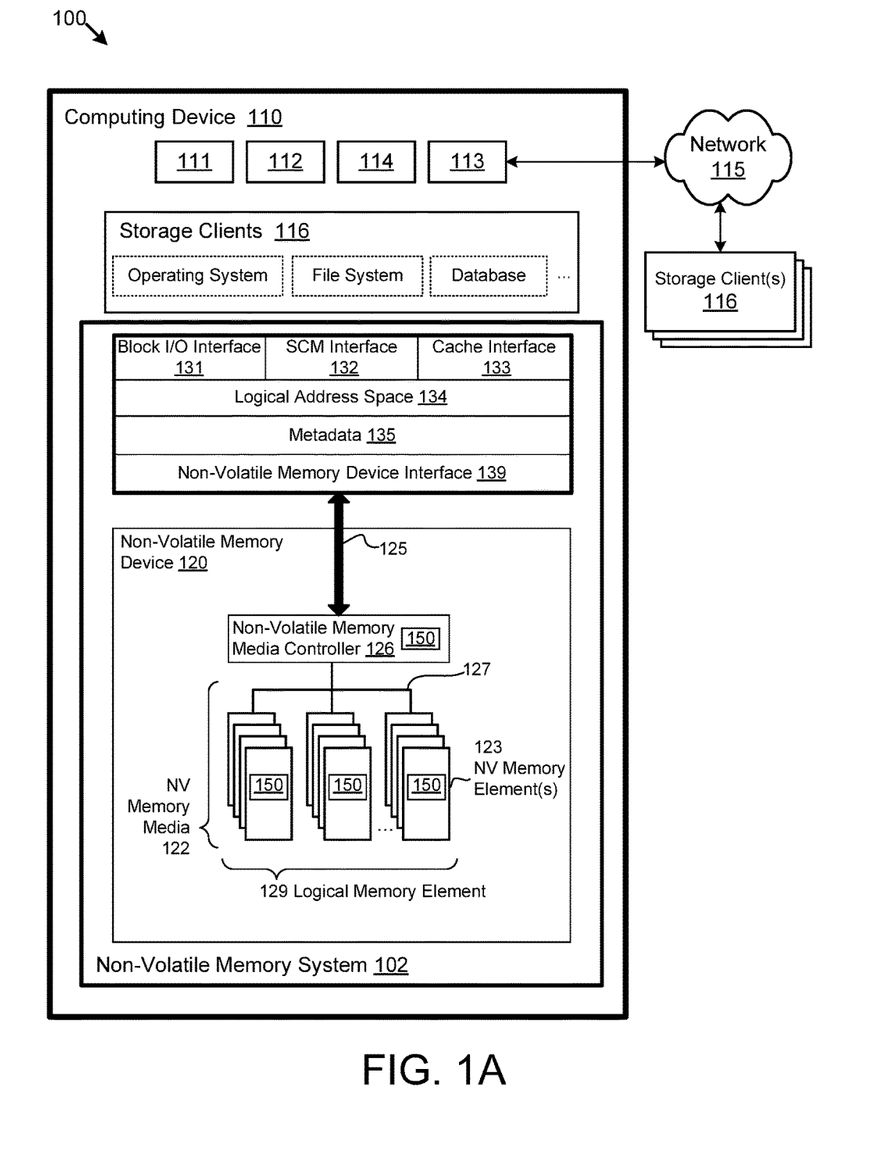
FIG. 1A is a schematic block diagram illustrating one embodiment of a system comprising a page register component.

FIG. 1A is a block diagram of one embodiment of a system 100 comprising a page register component 150 for a non-volatile memory device 120. The page register component 150 may be part of and/or in communication with a non-volatile memory media controller 126, a non-volatile memory element 123, a device driver, or the like. The page register component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor.

The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the page register component 150 may include one or more computer readable instructions stored on the non-transitory storage medium 114.

The non-volatile memory system 102, in the depicted embodiment, includes a page register component 150. The page register component 150, in one embodiment, is configured to use a shadow data latch to receive target data for a program operation that writes the target data to an array of storage cells. In a certain embodiment, the page register component 150, is configured to copy the target data to a write buffer data latch before additional target data is received by an adjacent shadow data latch. In a further embodiment, the page register component 150 is configured to write the target data from the write buffer data latch to the array. In various embodiments, copying target data from a shadow data latch to a write buffer data latch before additional target data is received by an adjacent shadow data latch may reduce data transfer latency compared to waiting for data to be received by multiple shadow data latches before a copy operation transfers the data to corresponding write buffer data latches. Shadow data latches and write buffer data latches are described in further detail below with regard to FIG. 2A and FIG. 2B In one embodiment, the page register component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the page register component 150 may comprise executable software code, such as a device driver or the like, stored on the computer readable storage medium 114 for execution on the processor 111. In a further embodiment, the page register component 150 may include a combination of both executable software code and logic hardware.

In one embodiment, the page register component 150 is configured to receive storage requests from a device driver or other executable application via a bus 125 or the like. The page register component 150 may be further configured to transfer data to/from a device driver and/or storage clients 116 via the bus 125. Accordingly, the page register component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the page register component 150 may receive storage requests as an API call from a storage client 116, as an IO-CTL command, or the like.

According to various embodiments, a non-volatile memory controller 126 comprising a page register component 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device 110 interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
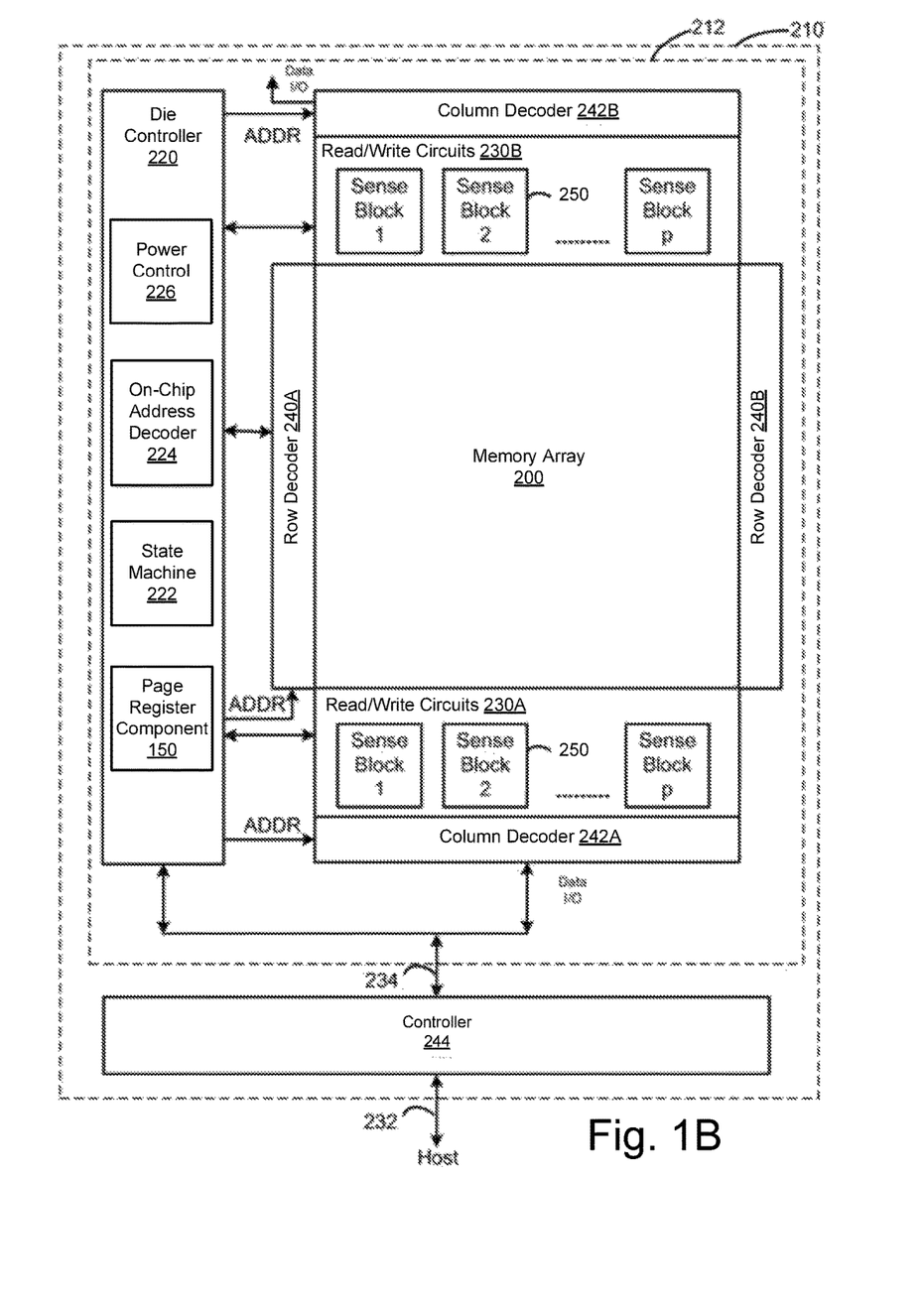
FIG. 1B is a schematic block diagram illustrating another embodiment of a system comprising a page register component.

FIG. 1B illustrates an embodiment of a non-volatile storage device 210 that may include one or more memory die or chips 212. The nonvolatile storage device 210 may be substantially similar to the nonvolatile memory device 120 described with reference to FIG. 1A. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a page register component 150, a state machine 222, an on-chip address decoder 224, and a power control circuit 226. The page register component 150, in one embodiment, is configured to use a set of write buffer data registers to store target data for a program operation for the memory array 200. In a further embodiment, the page register component 150 uses a set of shadow data registers to receive the target data, and copies the target data from the shadow data registers to the write buffer data registers transparently, so that a portion of the target data received by a shadow data register is copied to a corresponding write buffer data register while the shadow data register receives the portion of the target data.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In certain embodiments, the state machine 222 includes an embodiment of the page register component 150. The page register component 150, in some embodiments, controls the data supplied to the word lines and bit lines during memory operations. In one embodiment, the page register component 150 includes latches or data registers that store data for a program operation or a read operation. The page register component 150, in certain embodiments, may include software of a device driver, hardware in a device controller 244, hardware in a die controller 220 and/or state machine 222, and/or hardware in one or more sense blocks 250.

In one embodiment, one or any combination of die controller 220, page register component 150, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2A:
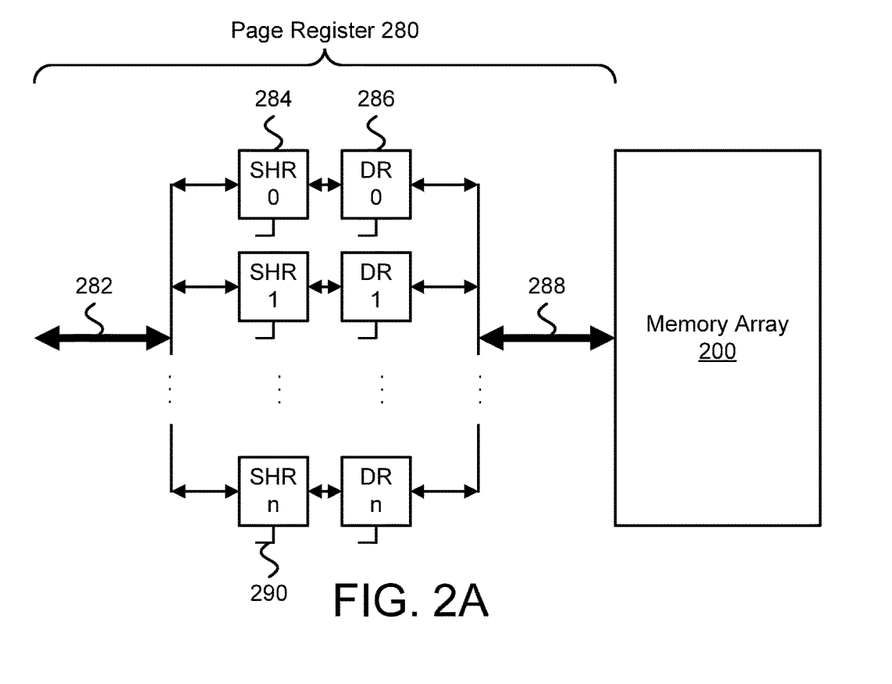
FIG. 2A is a schematic block diagram illustrating one embodiment of a page register in communication with a memory array.

FIG. 2A depicts one embodiment of a page register 280 in communication with a memory array 200. In a certain embodiment, a page register component 150, as described above with regard to FIG. 1A and FIG. 1B, may include one or more page registers 280, control components for one or more page registers 280, or the like. In the depicted embodiment, the page register 280 includes a data line 282 in communication with peripheral circuitry, shadow data registers 284, write buffer data registers 286, and a data line 288 in communication with the memory array 200. The memory array 200 may be an array of non-volatile storage cells, non-volatile memory cells, or the like, and may be substantially as described above with regard to FIG. 1B.

In general, in various embodiments, a page register 280 stores data for write or program operations, or for read operations, for the memory array 200. Data registers such as write buffer data registers 286, shadow data registers 284, or the like may be coupled to columns of the array, and provide caching or buffering during write or read operations.

In a certain embodiment, a page register 280 may support one or more modes for accessing the array 200. For example, in one embodiment, the memory array 200 may comprise a resistive memory medium such as ReRAM, Memristor memory, programmable metallization cell memory, phase-change memory (PCM, PCME, PRAM, PCRAM, ovonic unified memory, chalcogenide RAM, or C-RAM), or the like and the page register 280 may support two access modes: one mode comprising a legacy or compatibility mode which emulates a NAND flash access protocol (e.g., a NAND flash toggle mode), or the like, for clients 116 configured to use a legacy access protocol, and another mode comprising a native mode or burst mode that may provide full speed and/or access to the memory array 200 using features particular to the resistive memory medium.

For example, in a legacy access mode that implements or emulates a NAND flash access protocol, a page register 280 may receive and store a page of data (e.g., 4 KiB) in write buffer data registers 286, before writing the page of data to a row of the array 200. In another embodiment, in a burst access mode, a page register 280 may provide high-speed access by receiving and storing smaller data messages (e.g., 64 B) that are written to the array 200 before a full page of data is received. Thus, in certain embodiments, a page register 280 may buffer an amount of data other than a NAND flash page, but may nevertheless be referred to as a page register or page buffer.

In one embodiment, a set of write buffer data registers 286 is configured to store target data for a program operation for the array 200. In general, in various embodiments, a data register or latch such as a write buffer data register 286 (or write buffer latch), a shadow data register 284 (or shadow data latch), may include a static latch, an edge-triggered flip-flop, other logic circuits, gates, transistors, or other circuits or components capable of storing data. Target data stored by a write buffer data register 286 may refer to any data to be written or programmed to the array 200, and a write or program operation for the array 200 may refer to any operation that stores, writes, or programs target data in the array 200.

In one embodiment, the write buffer data registers 286 communicate target data for a program operation to corresponding columns of the array 200. In a certain embodiment, each write buffer data register 286 (labeled DR 0 through DR n in FIG. 2A) is coupled to a column of the array 200. In various embodiments, a column of the array 200 may refer to a group of storage cells of the array 200 that receives data to write to one of the storage cells of the column. For example, in certain embodiments, a column may refer to a bit line, a NAND string, or the like. In a further embodiment, a write buffer data register 286 coupled to a column of the array 200 may store one bit of data to be programmed to the column, and may communicate that bit of target data to the column during a program operation.

In one embodiment, the write buffer data registers 286 may be in one to one correspondence with columns of the array 200, so that each column is coupled to one write buffer data register 286. In another embodiment, multiple write buffer data registers 286 may correspond to or be coupled with one column of the array. For example, if a storage cell of the array is capable of storing three bits of data, three write buffer data registers 286 may be coupled to one column of the array 200, and may store three bits of data to write to one storage cell of the column.

A set of shadow data registers 284 (labeled SHR 0 through SHR n in FIG. 2A), in one embodiment, is configured to receive the target data for a program operation from peripheral circuitry for the array 200. In various embodiments, peripheral circuitry for the array 200 may include a die controller 220, a state machine 222, other managing circuits as described above with regard to FIG. 1B, or the like. The peripheral circuitry for the array 200 may receive data from a client 116 via lines 232, 234, bus 125, 127, or the like, or may receive data from elsewhere in a non-volatile memory device 120 due to a grooming or garbage collection operation, or the like.

In general, in various embodiments, the shadow data registers 284 communicate with the peripheral circuitry for the array 200, and the write buffer data registers 286 communicate with the array 200 itself. For example, in one embodiment, the shadow data registers 284 may receive target data for a program or write operation from the peripheral circuitry, and the write buffer data registers 286 may communicate the target data to columns of the array 200. As a further example, in a certain embodiment, the write buffer data registers 286 may receive read data from the columns of the array 200, and the shadow data registers 284 may communicate the read data to the peripheral circuitry. (In another embodiment, however, read data may be communicated directly from the array 200 to the peripheral circuitry without being stored in the write buffer data registers 286 or the shadow data registers 284.)

In various embodiments, the shadow data registers 284 are in communication with the write buffer data registers 286, and data is copied between the shadow data registers 284 and the write buffer data registers 286. For example, in one embodiment, read data received by the write buffer data registers 286 for a read operation is copied to the shadow data registers 284. In another embodiment, target data received by the shadow data registers 284 for a program operation is copied to the write buffer data registers 286.

Data lines 282, 288 communicate data between the page register 280 and the peripheral circuitry, or the array 200. In certain embodiments, it may be impractical to provide a data line to the array 200 for each write buffer data register 286, or for each column of the array 200. Similarly, in further embodiments, it may be impractical to provide a data line to the peripheral circuitry for each shadow data register 284. Thus, in one embodiment, the number of data lines may be reduced by coupling multiple write buffer data registers 286 to one data line 288 in communication with the memory array 200. Similarly, in a further embodiment, multiple shadow data registers 284 may be coupled to one data line 282 in communication with the peripheral circuitry. As used herein, a "set" of shadow data registers 284 or write buffer data registers 286 may refer to a group of data registers coupled to one data line 282 or one data line 288.

For convenience in description, data lines 282, 288 and the connections of data lines 282, 288 to shadow data registers 284 or write buffer data registers 286 may be described with reference to a write or program operation. For example, in the depicted embodiment, data line 282 may be referred to as an input line from the peripheral circuitry, coupled to inputs for a set of shadow data registers 284. Similarly, data line 288 may be referred to as an output line to the array 200, coupled to outputs for a set of write buffer data registers 286. In another embodiment, data flow for a read operation may be the reverse of a write operation, so that data line 288 provides input to write buffer data registers 286, and data line 282 receives output from shadow data registers 284. The description of data lines 282, 288 as an input line or an output line, respectively, for a write operation, does not limit the ability of the data lines 282, 288 to transport data in another direction for a read operation.

In certain embodiments, a set of latches or data registers that are coupled to one input line or output line may be configured to be activated one at a time to communicate via the input line or output line. For example, in one embodiment, the inputs for a set of shadow data registers 284 may be coupled to one input line 282 from the peripheral circuitry, and the shadow data registers 284 in the set may be configured to be activated one at a time to communicate via the input line 282. In a further embodiment, the outputs for the set of write buffer data registers 286 may be coupled to one output line 288 to the array 200, and the write buffer data registers 286 may be configured to be activated one at a time to communicate via the output line 288

As a further example, in the depicted embodiment, the shadow data registers 284 and write buffer data registers 286 include activation inputs 290 for each data register 284, 286. In various embodiments, a shadow buffer data register 284 or a write buffer data register 286 may communicate via an input line 282 or an output line 288 in response to receiving an activation signal (e.g., a voltage corresponding to a binary one) over an activation input 290. In a further embodiment, in the absence of an activation signal, a shadow buffer data register 284, or a write buffer data register 286 may be electrically isolated from the input line 282 or the output line 288. In certain embodiments, activating data registers one at a time to communicate via a common input line 282 or a common output line 288 may avoid shorts or other electrical faults that might occur if two data registers attempted to communicate different data (e.g., different voltages representing different data values) over the same line at the same time.

In a certain embodiment, receiving an activation signal on an activation input 290 may enable a shadow data register 284 to communicate via input line 282, or may enable a write buffer data register 286 to communicate via output line 288. However, in a further embodiment, shadow data registers 284 may be coupled to write buffer data registers 286 via individual (e.g., unshared) connections, and data may be transferred between a shadow data register 284 and a write buffer data register 286 thus coupled, even if the shadow data register 284 is not activated to communicate via the input line 282 or the write buffer data register 286 is not activated to communicate via the output line 288.

Thus, in one embodiment, target data for a program operation may be received by shadow data registers 284 one at a time, via input line 282, and may be written to the array 200 from write buffer data registers 286 one at a time, via output line 284. A data path time to receive data, before the data is programmed from the write buffer data registers 286 to the array 200, may include the time it takes for one shadow data register 284 to receive data, multiplied by the number of shadow data registers 284 that are receiving data, in a set of shadow data registers 284. In certain embodiments, the data path time (before programming begins) may additionally include time to copy data from shadow data registers 284 to write buffer data registers 286.

In some embodiments, the size of a set of shadow data registers 284 coupled to one input line 282, or the size of a corresponding set of write buffer data registers 286 coupled to one output line 288 may reflect a balance between the density of data lines 282, 288, and the additional time involved in accessing data registers 284, 286 in a set one at a time. For example, in one embodiment, a set of shadow data registers 284 may include eight shadow data registers 284, corresponding to eight columns of the array 200. In another embodiment, a set of shadow data registers 284 may include four shadow data registers 284, corresponding to four columns of the array 200. Various useful sizes for sets of data registers will be clear in view of this disclosure.

In a certain embodiment, programming data from a write buffer data register 286 to a column of the array 200 may involve enabling the write buffer data register 286, (e.g., via the activation input 290) until the data stored in that write buffer data register 286 is successfully or verifiably programmed to the corresponding column of the array 286. While one write buffer data register 286 is activated or enabled, remaining write buffer data registers 286 in a set may remain inactivated, to avoid shorting write buffer data register 286 outputs via a shared output line. Thus, during a program operation, data in a set of write buffer data registers 286 may not be available to a user or a client 166, even if input line 282 from the peripheral circuitry was connected directly to the write buffer data registers 286.

By contrast, in one embodiment, data received by a set of shadow data registers 284 and copied to write buffer data registers 286 may be maintained in the shadow data registers 284, such that the shadow data registers 284 are configured as a cache for the write buffer data registers 286. In a certain embodiment, configuring shadow data registers 284 as a cache for the corresponding write buffer data registers 286 may allow the data in the data registers 284, 286 to be accessed and used via input line 282 and the peripheral circuitry, without regard to whether one of the write buffer data registers 286 is activated for programming data to the array 200 via the output line 288. In a further embodiment, therefore, shadow data registers 284 configured as a cache for write buffer data registers 286 may maintain data in the shadow data registers 284 at least until the data has been written to the array 200.

In some embodiments (e.g., in a legacy mode implementing or emulating NAND flash protocol), time to copy data between shadow data registers 284 and write buffer data registers 286 may contribute significantly to data path latency. For example, in one embodiment, receiving program operation target data at one to eight shadow data registers 284 in a set, one a time, may take approximately 20 nanoseconds (ns) per shadow data register, and a copy operation transferring the target data from up to eight shadow data registers 284 to corresponding write buffer data registers 286 may take approximately 50 ns (e.g., 2 toggles of a 25 ns clock for the copy operation), even if all the data is transferred at once rather than one at a time. In such an embodiment, copy time for an explicit copy operation may be from approximately 24% to approximately 71% of the data path time between the peripheral circuitry and the write buffer data registers 286.

By contrast, in a certain embodiment, (e.g., in a native mode or burst mode that implements a higher-speed access protocol) a set of shadow data registers 284 may receive target data for a program operation, and a portion of the target data received by a shadow data register 284 may be copied to a corresponding write buffer data register 286 while the shadow data register 284 receives the portion of the target data. As used herein, a write buffer data register 286 "corresponds" to a shadow data register 284 if the write buffer data register 286 and the shadow data register 284 are coupled for data transfer directly between the write buffer data register 286 and the shadow data register 284. As an example of copying data while the data is being received, in the depicted embodiment, the shadow data register 284 labeled SHR 0 in FIG. 2A may be activated (via activation input 290) to receive data via input line 282, and the a portion of the target data being written to the shadow data register 284 may be written to write buffer data register 286 labeled DR 0 in FIG. 2A, while being received by the shadow data register 284 labeled SHR 0. In a further embodiment, the data received by the shadow data register 284 labeled SHR 0 may be copied to the write buffer data register 286 labeled DR 0 while the shadow data register 284 is activated to receive the data via the input line 282, even if a different write buffer data register 286 is activated to communicate data to the array 200 via the output line 288. In various embodiments, copying data to a write buffer data register 286 as the data is received by a shadow data register 284 may significantly reduce data path latency compared to an explicit copy operation after the data is received.

In a certain embodiment, program operation target data received by a shadow data register 284 may be copied to a write buffer data register 286 before additional target data is received by an adjacent shadow data register 284. In various embodiments, shadow data registers 284 or write buffer data registers 286 may referred to as adjacent, subsequent, consecutive, or the like, based on an order in which the data registers 284, 286 are accessed. For example, in the depicted embodiment, if program operation target data is received by the shadow data registers 284 in order from SHR 0, to SHR 1, and so on until SHR n, then SHR 0 and SHR 1 are adjacent, and SHR 1 is subsequent to SHR 0. Similarly, if the target data is written to the array 200 from the write buffer data registers 286, in order from DR 0, to DR 1, and so on until DR n, then DR 0 and DR 1 are adjacent, and DR 1 is subsequent to DR 0. In a certain embodiment, whether or not there may be some delay between a shadow data register 284 receiving data and the data being copied to a write buffer data register 286, (e.g., the data may take a short time to cross the shadow data register 284), copying the data from one shadow data register 284 to a write buffer data register 286 before additional data is received by an adjacent shadow data register 284 may significantly reduce data path latency compared to an explicit copy operation that takes place after data is received by multiple shadow data registers 284.

In one embodiment, a program operation writes a first portion of the target data from a first write buffer data register 286 to the array 200 while a subsequent shadow data register 284 receives a subsequent portion of the target data. For example, in one embodiment, shadow data register SHR 0 may receive a first portion of the target data for a program operation, which is copied to write buffer data register DR 0 as it is received by shadow data register SHR 0, and shadow data register SHR 1 may receive the next portion of the target data, which is copied to write buffer data register DR 1 as it is received by shadow data register SHR 1, while the first portion of the target data is being written from write buffer data register DR 0 to the array 200. Thus, in certain embodiments, copying data from shadow data registers 284 to corresponding write buffer data registers 286 as the data is received (or before subsequent data is received by subsequent shadow data registers 284) effectively allows a first write buffer data register 286 to write data to the array 200 while a subsequent write buffer data register 286 in a set that shares an output line 288 is receiving subsequent data.

In a certain embodiment, a read operation may be substantially the reverse of a program operation. In one embodiment, a set of write buffer data registers 286 may be configured to receive read data from the array 200, for a read operation. Read data may refer to any data read from the array 200. As an example of receiving read data, in a certain embodiment, a write buffer data register 286 may receive read data from a column of the array 200 via a sense amplifier coupled to data line 288, where the sense amplifier detects a signal representing stored data from the column and amplifies the signal to produce a recognizable logic level. In a further embodiment, a corresponding set of shadow data registers 284 may be configured to output the read data to the peripheral circuitry for the array. For example, shadow data registers 284 may communicate read data via data line 282. In one embodiment, a portion of the read data received by a write buffer data register 286 is copied to a corresponding shadow data register 284 while the write buffer data register 286 receives the portion of the read data. In certain embodiment, the read data received by a write buffer data register 286 is copied to a corresponding shadow data register 284 before additional read data is received by an adjacent write buffer data register 286. In various embodiments, copying read data as it is received, or before additional data is received by an adjacent write buffer data register 286 may significantly reduce data latency compared to copying data after it is received by multiple write buffer data registers 286.

In a certain embodiment, a controller such as die controller 220, controller 244, non-volatile memory media controller 126, a device driver, or the like, may determine or indicate whether a burst mode is set for the array 200. In one embodiment, a burst mode may be set for the array 200 on one chip, die, plane, or the like, and a burst mode may not be set for an array 200 on another chip, die, plane, or the like within the non-volatile memory device 120. In another embodiment, a burst mode may be set for the non-volatile memory device 120, and therefore also set for arrays 200 of each non-volatile memory element 123. In one embodiment, an array 200 may switch between a burst mode and another mode such as a legacy mode. In another embodiment, and array may configured to be used exclusively in a burst mode, or exclusively in a legacy mode, without switching.

In a certain embodiment, a controller may indicate whether a burst mode has been set, or is active or in use. For example, in one embodiment, an additional data line may be pulled high by the controller if a burst mode is set for the array 200, or pulled low by the controller if a burst mode is not set for the array 200. As another example, an IO-CTL command provided by a device driver may indicate whether a burst mode is set for an array 200. Various ways for various types of controller to indicate whether a burst mode has been set will be clear in view of this disclosure. In another embodiment, a controller may determine whether a burst mode has been set for an array. For example, in one embodiment, a controller may read configuration data to determine whether a burst mode has been set. In another embodiment, if an additional data line is used by one controller, such as non-volatile memory media controller 126, to indicate whether a burst mode has been set, the state of the data line may be sensed by another controller, such as die controller 220 to determine whether the burst mode has been set.

In one embodiment, copying a portion of program operation target data received by a shadow data register 284 to a corresponding write buffer data register 286 while the shadow data register 284 receives the data (or before additional target data is received by an adjacent shadow data register 284) is in response to the controller determining or indicating that the burst mode is set for the array. In another embodiment, the set of shadow data registers 284 may be configured to copy multiple bits or portions of the target data to corresponding write buffer data registers 286 after the shadow data registers 284 receive the multiple portions of the target data, in response to the controller determining or indicating that the burst mode is not set for the array. Thus, in various embodiments, a burst mode may provide low latency data transfer with caching by shadow data registers 284, by copying data to a write buffer data register 286 as it is received by a shadow data register 284, (or before additional target data is received by an adjacent shadow data register 284). By contrast, if a burst mode is not set or in use, a legacy mode may implement or emulate expected behavior for NAND flash by copying multiple bits of data (e.g. a page) from shadow data registers 284 to write buffer data registers 286 after the shadow data registers 284 receive the multiple bits of target data.

Figure 2B:
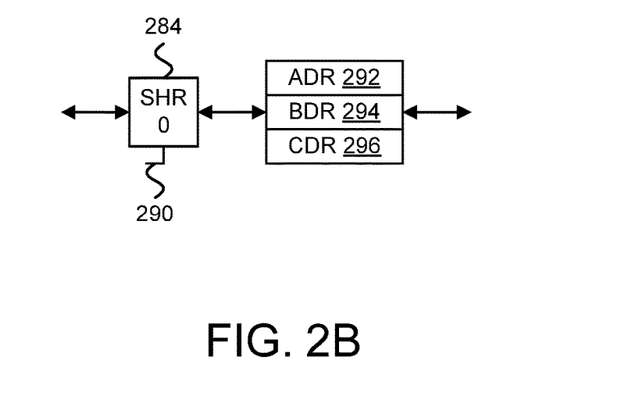
FIG. 2B is a schematic block diagram illustrating one embodiment of a shadow data register and a write buffer data register.

FIG. 2B is a schematic block diagram illustrating one embodiment of a shadow data register 284 and multiple write buffer data registers ADR 292, BDR 294, and CDR 296. The shadow data register 284 and the write buffer data registers 292, 294, 296 may be substantially similar to shadow data registers 284 and write buffer data registers 286 as described above with regard to FIG. 2A, including data lines, activation inputs 290 and the like.

In the depicted embodiment, the shadow data register 284 and the write buffer data registers 292, 294, 296 correspond to one column of the array 200. As described above with regard to FIG. 2A, a page register 280 may include multiple such registers, corresponding to multiple columns of the array 200.

In various embodiments, certain types of storage cells may store more than one bit of data per cell. For example, in triple level cell (TLC) NAND flash memory, a cell may store three bits of data per cell. In further embodiments, therefore, a program operation may write multiple bits of data, from multiple write buffer data registers 292, 294, 296, to one storage cell, via one column of the array 200. Thus, in various embodiments, multiple write buffer data registers 292, 294, 296 may correspond to a column of the array 200. For example, in the depicted embodiment, write buffer data registers 292, 294, 296 are coupled to a column of the array: ADR 292 may be configured to store a lower page bit, while BDR 294 stores a middle page bit, and CDR 296 stores an upper page bit. Fewer or more write buffer data registers may be coupled to a column of the array, based on the number of bits stored per cell.

In a certain embodiment, portions of program operation target data for multiple write buffer data registers 292, 294, 296 corresponding to a column of the array 200 may be received by one shadow data register 284 for the column. In various embodiments, data received by one shadow data register 284 may be distributed to multiple write buffer data registers in various ways. For example, in one embodiment, a buffer selection signal may indicate which write buffer data registers 292, 294, 296 to copy data to, from the shadow data register 284. In another embodiment, multiple write buffer data registers 292, 294, 296 may be configured as a shift register, so that multiple bits of data received by the shadow data register 284 are shifted into the appropriate write buffer data registers 292, 294, 296.

Figure 3:
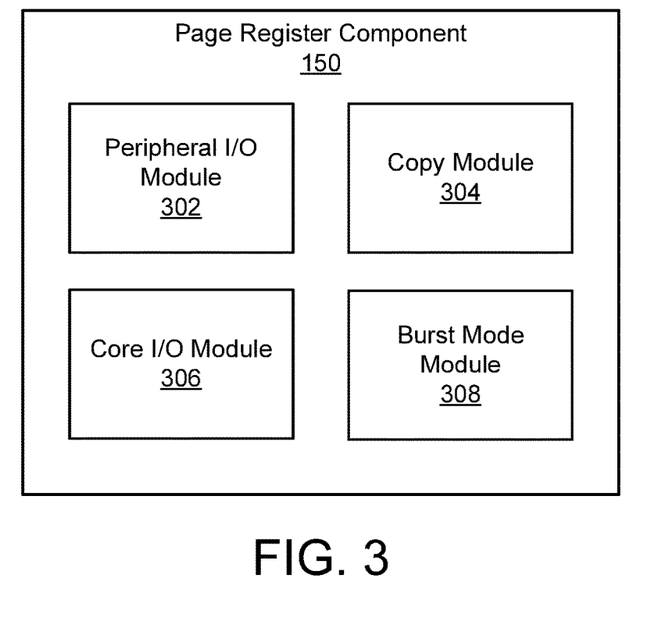
FIG. 3 is a schematic block diagram illustrating one embodiment of a page register component.

FIG. 3 depicts one embodiment of a page register component 150. The page register component 150 may be substantially similar to the page register component 150 described above with regard to FIG. 1A and FIG. 1B, and may include one or more page registers 280 as described above with regard to FIG. 2A. In general, as described above, the page register component 150 receives program operation target data using a shadow data latch or shadow data register, copies the target data to a write buffer data latch or register before additional target data is received by an adjacent shadow data latch, and writes the target data from the write buffer data latch to an array of non-volatile memory cells. In the depicted embodiment, the page register component 150 includes a peripheral I/O module 302, a copy module 304, a core I/O module 306, and a burst mode module 308. In another embodiment, the page register component 150 includes the peripheral I/O module 302, the copy module 304, and the core I/O module 306, without a burst mode module 308. In various embodiments, the peripheral I/O module 302, copy module 304, and core I/O module 306, without a burst mode module 308

In certain embodiments, a controller such as the non-volatile memory media controller 126, die controller 220, or the like may include the peripheral I/O module 302, copy module 304, and core I/O module 306. In one embodiment, the controller may include a hardware controller, such as non-volatile memory media controller 126, for a storage device that includes the non-volatile memory medium 122. In another embodiment, the controller may include a device driver, for a storage-device includes the non-volatile memory medium 122. In a further embodiment, the device driver may include logic hardware and/or executable code stored on one or more computer readable storage media In general, in various embodiments, the peripheral I/O module 302 manages or controls communication between shadow data latches or registers and peripheral circuitry for an array of memory cells. The peripheral I/O module 302, in one embodiment, is configured to receive target data, using a shadow data latch, for a program operation that writes the target data to an array of non-volatile memory cells. For example, in one embodiment, the peripheral I/O module 302 may include or be in communication with a set of shadow data latches or registers as described above with regard to FIG. 2A and FIG. 2B. In a further embodiment, the peripheral I/O module 302 may be configured to receive additional target data using adjacent shadow data latches. For example, in various embodiments, the peripheral I/O module 302 may receive multiple bits of target data using a set of shadow data latches sharing a common input line. In a certain embodiment, the peripheral I/O module 302 may receive target data using a shadow data latch by activating the shadow data latch to receive the target data over an input line shared by a set of shadow data latches.

The copy module 304, in one embodiment (e.g., in a burst mode), is configured to copy program operation target data received by a shadow data latch to a write buffer data latch before additional target data is received by an adjacent shadow data latch. In another embodiment (e.g., in a legacy mode), the copy module 304 may copy multiple bits of target data from a plurality of shadow data latches to a corresponding plurality of write buffer data latches after the plurality of shadow data latches receives the multiple bits of target data.

In certain embodiments, the burst mode module 308 may determine whether a burst mode is set for an array of memory cells, and may cooperate with the copy module 304, so that the copy module 304 copies target data received by a shadow data latch to a write buffer data latch before additional target data is received by an adjacent shadow data latch, in response to the burst mode module 308 determining that the burst mode is set for the array. In a further embodiment, the copy module 304 may copy multiple bits of target data to write buffer data latches after the multiple bits are received by multiple shadow data latches, in response to the burst mode module 308 determining that the burst mode is not set for the array.

In one embodiment, the peripheral I/O module 302 may receive further target data for one column of the array, using a shadow data latch, and the copy module 304 may copy the further target data to one or more additional write buffer data latches for the column. For example, as described above with regard to FIG. 2B, multiple write buffer data latches may be couple to one column of an array, so that multiple bits can be written to one storage cell of the array, and the copy module 304 may manage the data coming into one shadow data latch such that the correct data is copied to each of the multiple write buffer data latches.

In general, in various embodiments, the core I/O module 306 manages or controls communication between write buffer data latches or registers and a core array of memory cells. The core I/O module 306, in one embodiment, is configured to write target data from a write buffer latch to the array, where the target data is received by the peripheral I/O module 302 and copied to the write buffer data latch by the copy module 304. For example, in one embodiment, the core I/O module 306 may include or be in communication with a set of write buffer data latches or registers as described above with regard to FIG. 2A and FIG. 2B. In a further embodiment, the core I/O module 306 may write target data to the array by activating a write buffer data latch to write the target data over an output line shared by a set of write buffer data latches. In a certain embodiment, the core I/O module 306 and the peripheral I/O module 302 may cooperate so that the core I/O module 306 writes target data from a write buffer data latch to the array while the peripheral I/O module 302 receives additional target data using an adjacent shadow data latch (e.g., a shadow data latch corresponding to an adjacent column of the array).

In one embodiment, the peripheral I/O module 302 may maintain target data in a shadow data latch such that the shadow data latch is configured as a cache for a write buffer data latch (to which the target data is copied by the copy module 304). For example, in one embodiment, the peripheral I/O module 302 may maintain target data in a shadow data latch by timing or otherwise controlling inputs so that the target data in the shadow data latch is not overwritten until the core I/O module 306 has written the target data from the write buffer data latch to the array.

In a certain embodiment, a read operation may be substantially the reverse of a program or write operation. Thus, in one embodiment, the core I/O module 306 may be configured to read data from the array to a write buffer data latch. In some embodiments, the copy module 304 may be configured to copy the read data to a shadow data latch before additional read data is received by an adjacent write buffer data latch. In further embodiments, the peripheral I/O module 302 may be configured to output the read data from the shadow data latch to peripheral circuitry for the array. In another embodiment, however, the core I/O module 306 and/or the peripheral I/O module 302 may provide read data from the array to the peripheral circuitry without buffering the data in a page register.

Figure 4:
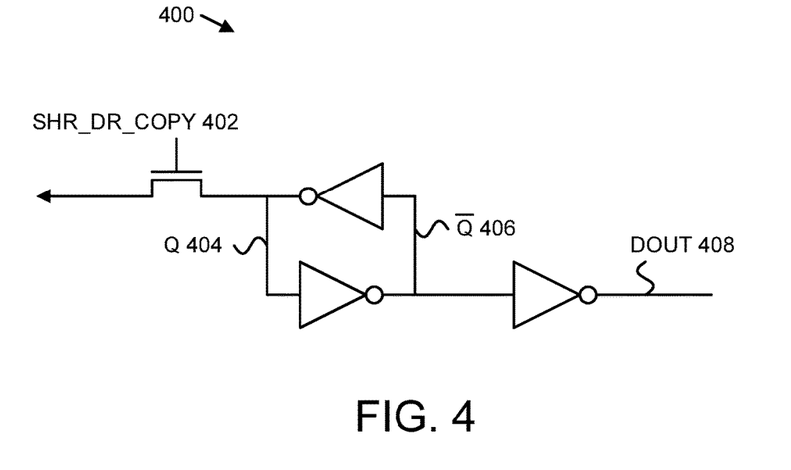
FIG. 4 is a circuit diagram illustrating one embodiment of a write buffer data register

FIG. 4 depicts one embodiment of a write buffer data register 400. In certain embodiments, the write buffer data register 400 may substantially similar to the write buffer data registers 286, 292, 294, 296 described above with regard to FIG. 2A and FIG. 2B. In the depicted embodiment, the DOUT line 408 may connect the output of the write buffer data register 400 to a memory array. For example, the DOUT line 408 may connect to a shared output line, such as line 288 of FIG. 2A, that is in communication with the array. In a certain embodiment, the DOUT line 40 may be enabled based on an activation input (not shown in FIG. 4) to the write buffer data register 400. The voltage of the Q 404 line may correspond to a stored data bit for the write buffer data register 400, and the inverse Q line 406 may correspond to the inverse of the stored bit.

In the depicted embodiment, the SHR_DR_COPY line 402 controls data copying between a shadow data register and the write buffer data register 400. Input to the write buffer data register 400 may be further controlled by additional connections to Q 404, with additional transistors or control circuits in series or in parallel with the transistor controlled by SHR_DR_COPY 402, which are not shown in FIG. 4 for convenience in describing SHR_DR_COPY 402.

In general, in various embodiments, if SHR_DR_COPY 402 is pulled high, then the write buffer data register 400 is connected (via the transistor controlled by SHR_DR_COPY 402) to a shadow data register. Thus, in a write operation, if a shadow data register is enabled to receive target data, and the SHR_DR_COPY 402 line is high for a corresponding write buffer data register 400, then data will be copied to the write buffer data register 400 while the shadow data register receives the data. Conversely, for a read operation, if a write buffer data register 400 is enabled to receive read data from the memory array, and the SHR_DR_COPY 402 line is high, then data will be copied to the corresponding shadow data register while the write buffer data register 400 receives the data. However, if SHR_DR_COPY 402 is low, then the transistor controlled by SHR_DR_COPY 402 decouples the connection between the write buffer data register 400 and the corresponding shadow data register. In certain embodiments, SHR_DR_COPY 402 may be low while shadow data registers are in active use as a cache for write buffer data registers 400, so that cache operations that activate or enable a shadow data register will not change data in a write buffer data register 400.

Figure 5:
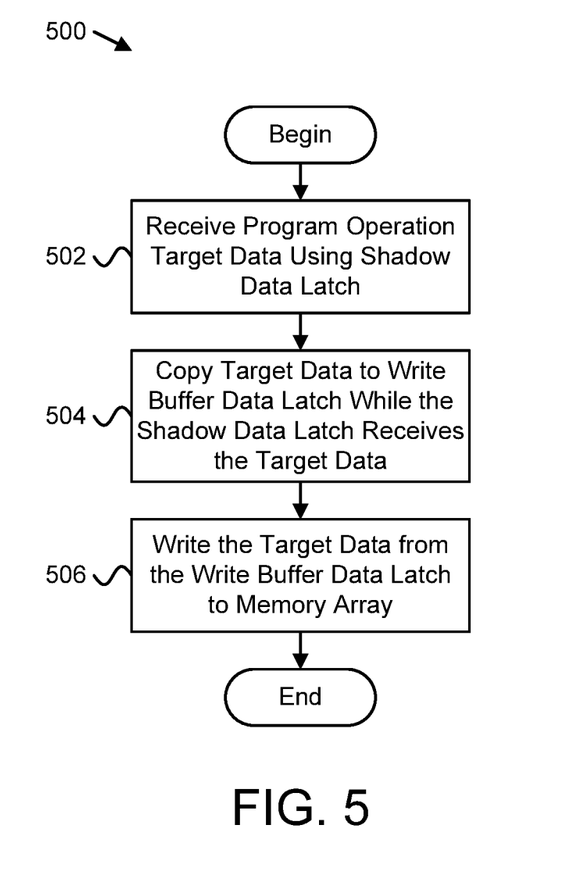
FIG. 5 is a schematic flow chart diagram illustrating one embodiment of a method for data register copying.
Figure 6:
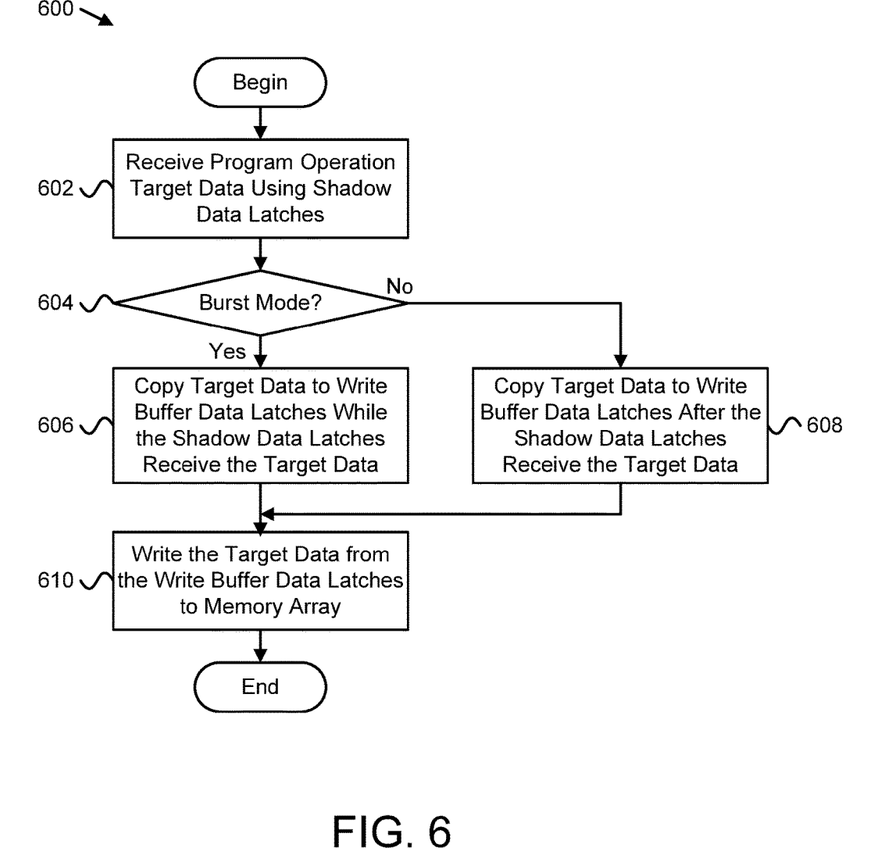
FIG. 6 is a schematic flow chart diagram illustrating a further embodiment of a method for data register copying.

FIG. 5 is a schematic flow chart diagram illustrating one embodiment of a method 500 for data register copying. The method 500 begins and the peripheral I/O module 302 receives 502 target data using a shadow data latch, for a program operation that writes the target data to an array of non-volatile memory cells. The copy module 304 copies 504 the target data to a write buffer data latch while the shadow data latch receives 502 the target data. The core I/O module 306 writes 506 the target data from the write buffer data latch to the array, and the method 500 ends FIG. 6 is a schematic flow chart diagram illustrating a further embodiment of a method for data register copying. The method 600 begins and the peripheral I/O module 302 receives 602 target data using shadow data latches, for a program operation that writes the target data to an array of non-volatile memory cells. The burst mode module 308 determines 604 whether a burst mode is set for the array. If a burst mode is set for the array, then the copy module 304 copies 606 the target data to write buffer data latches while the shadow data latches receive 602 the target data. If a burst mode is not set for the array, then the copy module 304 copies 608 the target data to write buffer data latches after the shadow data latches receive 602 the target data. The core I/O module 306 writes 610 the target data from the write buffer data latches to the array, and the method 600 ends.

A means for receiving target data for a program operation, in various embodiments may include a peripheral I/O module 302, a page register component 150, a page register, a set of shadow data registers, an input line for a set of shadow data registers, a processor, a die controller, a die state machine, a non-volatile memory controller, a non-volatile memory media controller, a device driver, other logic hardware, and/or other executable code stored on a computer readable storage medium. Other embodiments may include similar or equivalent means for receiving target data.

A means for copying the target data to a set of write buffer data registers, in various embodiments may include a copy module 304, a page register component 150, a page register, a set of connections between shadow data registers and write buffer data registers, a processor, a die controller, a die state machine, a non-volatile memory controller, a non-volatile memory media controller, a device driver, other logic hardware, and/or other executable code stored on a computer readable storage medium. Other embodiments may include similar or equivalent means for copying target data.

A means for writing the target data from set of write buffer data registers to a non-volatile memory array, in various embodiments, may include a core I/O module 306, a page register component 150, a page register, a set of write buffer data registers, an output line for a set of write buffer data registers, a processor, a die controller, a die state machine, a non-volatile memory controller, a non-volatile memory media controller, a device driver, other logic hardware, and/or other executable code stored on a computer readable storage medium. Other embodiments may include similar or equivalent means for writing target data.

A means for determining whether a burst mode is set, in various embodiments, may include a burst mode module 308, a page register component 150, a processor, a die controller, a die state machine, a non-volatile memory controller, a non-volatile memory media controller, a device driver, other logic hardware, and/or other executable code stored on a computer readable storage medium. Other embodiments may include similar or equivalent means for determining whether a burst mode is set.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   an array of non-volatile storage cells;
   a controller configured to indicate whether a burst mode is set for the array;
   a set of write buffer data registers configured to store target data for a program operation for the array, wherein the write buffer data registers communicate the target data to corresponding columns of the array; and
   a set of shadow data registers configured to receive the target data from peripheral circuitry for the array, wherein a portion of the target data received by a shadow data register is duplicated at a corresponding write buffer data register while the shadow data register receives the portion of the target data in response to the controller indicating that the burst mode is set for the array.

2. The apparatus of claim 1, wherein the set of shadow data registers is configured to copy multiple portions of the target data to corresponding write buffer data registers after the shadow data registers receive the multiple portions of the target data, in response to the controller indicating that the burst mode is not set for the array.

3. The apparatus of claim 1, wherein a program operation writes a first portion of the target data from a first write buffer data register to the array while a subsequent shadow data register receives a subsequent portion of the target data.

4. The apparatus of claim 1, wherein data duplicated at the write buffer data registers is maintained in the shadow data registers, such that the shadow data registers are configured as a cache for the write buffer data registers.

5. The apparatus of claim 1, wherein multiple write buffer data registers correspond to a column of the array, and wherein portions of the target data for the multiple write buffer data registers are received by one shadow data register for the column.

6. The apparatus of claim 1, wherein:
   the set of write buffer data registers is further configured to receive read data from the array for a read operation; and
   the set of shadow data registers is further configured to output the read data to the peripheral circuitry for the array, wherein a portion of the read data received by a write buffer data register is duplicated at a corresponding shadow data register while the write buffer data register receives the same portion of the read data.

7. The apparatus of claim 1, wherein the inputs for the set of shadow data registers are coupled to one input line from the peripheral circuitry, and the shadow data registers are configured to be activated one at a time to communicate via the input line.

8. The apparatus of claim 1, wherein the outputs for the set of write buffer data registers are coupled to one output line to the array, and the write buffer data registers are configured to be activated one at a time to communicate via the output line.

9. A method comprising:
   receiving target data, using a shadow data latch, for a program operation that writes the target data to an array of non-volatile memory cells;
   determining whether a burst mode is set for the array;
   copying the target data to a write buffer data latch before additional target data for the program operation using the array is received by an adjacent shadow data latch, in response to determining that the burst mode is set for the array; and
   writing the target data from the write buffer data latch to the array.

10. The method of claim 9, further comprising copying multiple bits of target data from a plurality of shadow data latches to a corresponding plurality of write buffer data latches after the plurality of shadow data latches receives the multiple bits of target data, in response to determining that the burst mode is not set for the array.

11. The method of claim 9, further comprising receiving the additional target data using the adjacent shadow data latch while writing the target data from the write buffer data latch to the array.

12. The method of claim 9, further comprising maintaining the target data in the shadow data latch such that the shadow data latch is configured as a cache for the write buffer data latch.

13. The method of claim 9, further comprising receiving further target data for one column of the array, using the shadow data latch, and copying the further target data to one or more additional write buffer data latches for the column.

14. The method of claim 9, further comprising:
   reading data from the array to the write buffer data latch;
   copying the read data to the shadow data latch before additional read data is received by an adjacent write buffer data latch; and
   outputting the read data from the shadow data latch to peripheral circuitry for the array.

15. The method of claim 9, wherein receiving the target data comprises activating the shadow data latch to receive the target data over an input line shared by a set of shadow data latches.

16. The method of claim 9, wherein writing the target data comprises activating the write buffer data latch to write the target data over an output line shared by a set of write buffer data latches.

17. An apparatus comprising:
   means for receiving target data, using a set of shadow data registers, for a program operation that writes the target data to an array of non-volatile storage cells;
   means for determining whether a burst mode is set for the array;
   means for copying portions of the target data to a set of write buffer data registers, such that a portion of the target data received by a shadow data register is copied to a corresponding write buffer data register before a subsequent portion of the target data is received by an adjacent shadow data register, in response to determining that the burst mode is set for the array; and
   means for writing the target data from the set of write buffer data registers to the array.

* * * * *